United States Patent
Kong et al.

(10) Patent No.: US 6,787,285 B2
(45) Date of Patent: Sep. 7, 2004

(54) PATTERN WIDTH SLIMMING-INHIBITING METHOD OF PHOTORESIST PATTERN USING PHOTORESIST COMPOSITION CONTAINING THERMAL ACID GENERATOR

(75) Inventors: Keun Kyu Kong, Kyoungki-do (KR); Gyu Dong Park, Kyoungki-do (KR); Jae Chang Jung, Kyoungki-do (KR); Ki Soo Shin, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 269 days.

(21) Appl. No.: 10/006,633

(22) Filed: Dec. 5, 2001

(65) Prior Publication Data
US 2002/0081504 A1 Jun. 27, 2002

(30) Foreign Application Priority Data
Dec. 27, 2000 (KR) .................. 2000-82823

(51) Int. Cl.[7] .............. G03F 7/004; G03F 7/30; G03F 7/40

(52) U.S. Cl. .............. 430/270.1; 430/311; 430/326; 430/330; 430/942; 430/967; 430/914; 430/921

(58) Field of Search ............ 430/270.1, 311, 430/326, 330, 942, 967, 914, 921

(56) References Cited

U.S. PATENT DOCUMENTS 6,132,926 A * 10/2000 Jung et al. ............. 430/270.1
6,627,384 B1 * 9/2003 Kim et al. ............. 430/280.1

FOREIGN PATENT DOCUMENTS

JP 2001109143 A * 4/2001 ......... G03F/7/004
JP 2001188341 A * 7/2001 ......... G03F/7/004

* cited by examiner

Primary Examiner—Amanda Walke
(74) Attorney, Agent, or Firm—Marshall, Gerstein & Borun LLP

(57) ABSTRACT

A pattern width slimming-inhibiting method of photoresist pattern using photoresist composition containing thermal acid generator. When the formed pattern is heated, a thermal generator generates acid during the heating process, and a cross-linking reaction occurs to photoresist compositions, thereby preventing pattern width slimming due to SEM-beam for CD measurement.

17 Claims, 4 Drawing Sheets

PATTERN WIDTH SLIMMING-INHIBITING METHOD OF PHOTORESIST PATTERN USING PHOTORESIST COMPOSITION CONTAINING THERMAL ACID GENERATOR

BACKGROUND

1. Technical Field

A method for inhibiting pattern width slimming or reduction of photoresists is disclosed. In particular, a method for inhibiting pattern width slimming due to the beam emitted by a scanning electron microscope (hereinafter, it is abbreviated to "SEM") while measuring a critical dimension (hereinafter, it is abbreviated to "CD") of a photoresist pattern obtained by using a photoresist composition comprising thermal acid generator is disclosed.

2. Description of the Prior Art

Typically, the semiconductor processing is carried out by setting up a CD target and the SEM measures the CD when a photoresist pattern is formed. When the CD is measured immediately after a pattern is formed, the CD is almost identical with a target. However, thirty seconds after the CD measurement by the SEM, that is, during the observation by the SEM, width of the pattern gets slimmed. The basic mechanism of the SEM is that image is seen through e-beam projected under high vacuum. Most of the ArF photoresist gets cracked due to e-beam and at that time, the cracked parts are disappeared due to high vacuum, which consequently slims pattern width. Therefore, there were many problems in establishing the CD target during a semiconductor processing because measuring the CD itself is very difficult.

SUMMARY OF THE DISCLOSURE

A method for preventing a photoresist pattern from being slimming while measuring its CD using SEM is disclosed by forming the photoresist pattern using a photoresist composition containing a thermal acid generator and additionally heating the formed photoresist pattern after developing step.

DETAILED DESCRIPTION OF THE PRESENTLY PREFERRED EMBODIMENTS

Figure 1A:
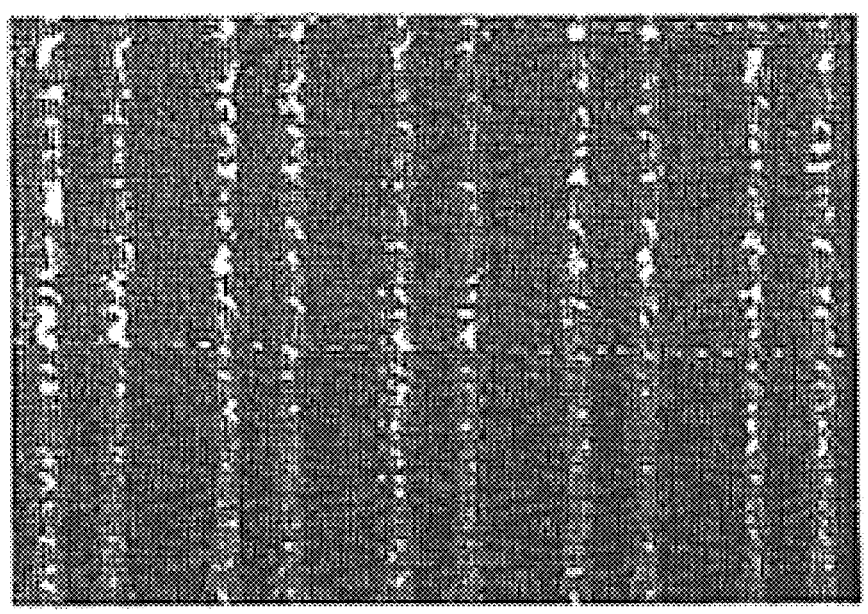
FIG. 1A is a photograph of a photoresist pattern obtained according to a conventional method that is taken immediately after the CD measurement using a SEM.

A process for producing a photoresist pattern according to the present invention includes the steps of:

(a) coating a photoresist composition containing a thermal acid generator on a substrate to form a photoresist film;

(b) exposing the photoresist film;

(c) developing the exposed photoresist film to obtain a photoresist pattern; and (d) heating the photoresist pattern.

The photoresist composition includes a thermal acid generator, chemically amplified photoresist resin, a photoacid generator and organic solvent.

Exemplary thermal acid generator is alcohol having a leaving group, preferably a cyclic alcohol whose ortho-position is substituted with the leaving group. It has been found by the inventors that a sulfonate group is particularly useful as the leaving group.

Some of preferred thermal acid generators are disclosed, but are not limited to, as following Formulas 1 to 4:

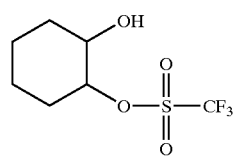

Formula 1

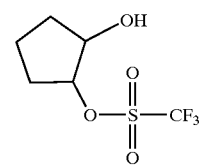

Formula 2

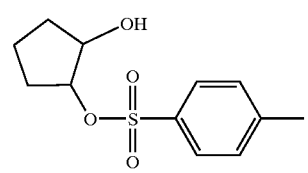

Formula 3

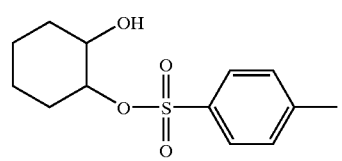

Formula 4

The thermal acid generator is generally used in an amount of ranging from about 0.1 to about 5 wt % based on that of the photoresist resin employed.

The photoresist resin of the photoresist composition can be any currently known chemically amplified photoresist polymer disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0 789 278 (Aug. 13, 1997) and U.S. Pat. No. 6,132,926 (Oct. 17, 2000).

As for the chemically amplified photoresist resin of the present invention, cyclo olefin repeating unit having hydroxyalkyl functional group is employed in order to form a cross-linking bond and to improve adhesiveness to the substrate. And cyclo olefin repeating unit having carboxyl functional group or maleic anhydride repeating unit can be further included in the photoresist resin.

It is preferable the photoresist polymer is prepared by radical additional polymerization of cycloolefin repeating units and the ring structures of the cycloolefin repeating units remains in the main chain of the polymer.

More preferred photoresist polymer is poly(tert-butyl bicyclo[2.2.1]hept-5-ene-2-carboxylate/2-hydroxyethyl bicyclo[2.2.1]hept-5-ene-2-carboxylate/bicyclo[2.2.1]hept-5-ene-2-carboxylic acid/maleic anhydride).

In addition, the photoresist resin should not flow at about 150° C. or higher, the point where the thermal acid generator begins to release an acid.

Any of conventional photoacid generator, which is able to generate acids when it is exposed to light, can be used. Some of them are disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0789 278 (Aug. 13, 1997) and U.S. Pat. No. 6,132,926 (Oct. 17, 2000).

Preferred photoacid generators have a relatively low light absorbency in the wavelengths of 157 nm and 193 nm. More preferably, the photoacid generator is diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, triphenylsulfonium hexafluoroarsenate, triphenylsulfonium hexafluoroantimonate, triphenylsulfonium triflate, dibutylnaphthylsulfonium triflate, phthalimidotrifluoromethane sulfonate, dinitrobenzyltosylate, n-decyl disulfone, naphthylimido trifluoromethane sulfonate or mixture thereof.

The photoacid generator is used in an amount ranging from about 0.1 to about 10% by weight of the photoresist polymer employed. It has been found that when the photoacid generator is used in the amount less than about 0.1%, it lowers photosensitivity of the photoresist composition, and when the photoacid generator is used in the amount greater than about 10%, it results in a poor pattern formation due to its high absorption.

On the other hand, any of conventional organic solvent can be employed for this invention and some of them are disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0789 278 (Aug. 13, 1997) and U.S. Pat. No. 6,132,926 (Oct. 17, 2000).

Preferred organic solvent for photoresist composition is diethyleneglycol diethyl ether, methyl 3-methoxypropionate, ethyl 3-ethoxypriopionate, propyleneglycol methyl ether acetate, ethyl lactate, cyclohexanone, 2-heptanone or mixture thereof.

The amount of solvent used is preferably in an amount ranging from about 100 to about 2000 wt % of the photoresist resin employed in order to obtain a photoresist film having intended thickness.

Exemplary light sources which are useful for forming the photoresist pattern include, EUV (Extreme Ultra Violet), VUV (Vacuum Ultra Violet; 157 nm), ArF (193 nm), KrF (248 nm), E-beam, X-ray or ion beam.

The process for forming the photoresist pattern can further include a soft baking which is performed before the step (b) and/or a post baking which is performed after the step (b). Preferably, the soft and post baking steps are performed at temperature of around 110° C. As long as the temperature does not exceed 150° C., no acid is generated from the thermal acid generator during the soft baking or post baking process.

Preferably, the heating step (d) is carried out at a temperature higher than 150° C., where a thermal acid generator begins to release an acid, and more preferably, at a temperature range from about 150 to about 250° C.

In contrast to the conventional method for forming a photoresist pattern, an additional step of heating the formed pattern is carried out, in which acid is generated by a thermal acid generator. The produced acid catalyzes cross-linking reaction, between hydroxyl group and carboxyl group; hydroxyl group and maleic anhydride; or carboxyl group and maleic anhydride in photoresist resins.

Another embodiment provides a semiconductor element that is manufactured using the photoresist composition described above.

The disclosed methods will now be described in more detail by referring to the examples below, which are not intended to be limiting.

COMPARATIVE EXAMPLE

Figure 1B:
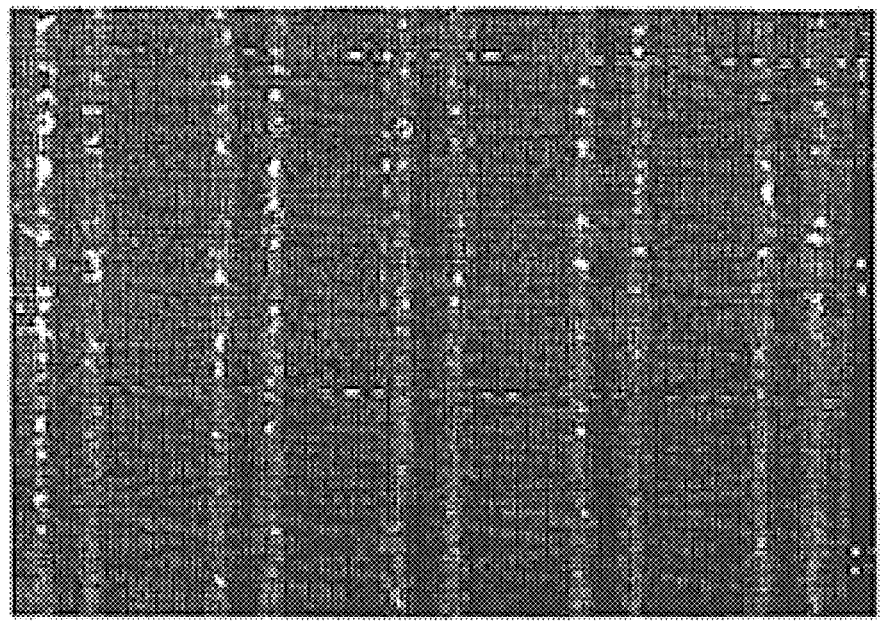
FIG. 1B is a photograph of a photoresist pattern obtained according to the conventional method that is taken after approximately thirty seconds since the CD measurement using the SEM.

To 7.2 g of PGMEA (propylene glycol methyl ether acetate) solvent was added 1 g of poly(tert-butyl bicyclo[2.2.1]hept-5-ene-2-carboxylate/2-hydroxyethyl bicyclo[2.2.1]hept-5-ene-2-carboxylate/bicyclo[2.2.1]hept-5-ene-2-carboxylic acid/maleic anhydride) and 0.012 g of triphenylsulfonium triflate, and the resultant was filtered to obtain a photoresist composition. The photoresist composition was coated on the silicon wafer, baked at 110° C. for 90 seconds and exposed to light using ArF laser exposing device. The photoresist composition was post-baked at 110° C. for 90 seconds, and developed in 2.38 wt % aqueous TMAH solution to obtain a 138 nm L/S pattern right after measuring the CD of the pattern using the SEM (see FIG. 1A). Thirty seconds after the measurement by the SEM, the pattern was slimmed by 26 nm, that is the pattern became 112 nm L/S pattern (see FIG. 1B).

INVENTION EXAMPLE

Figure 2A:
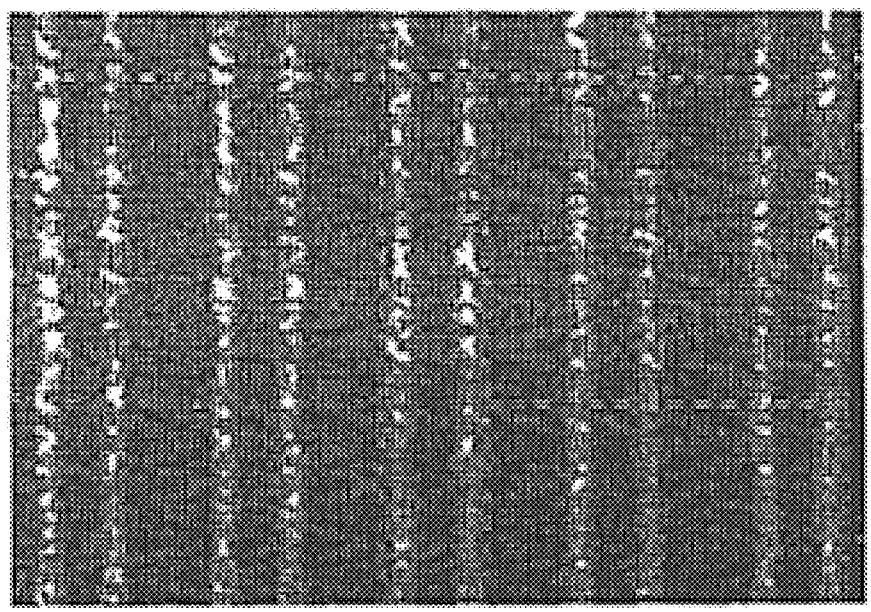
FIG. 2A is a photograph of a photoresist pattern obtained according to the present invention that is taken immediately after the CD measurement using the SEM.
Figure 2B:
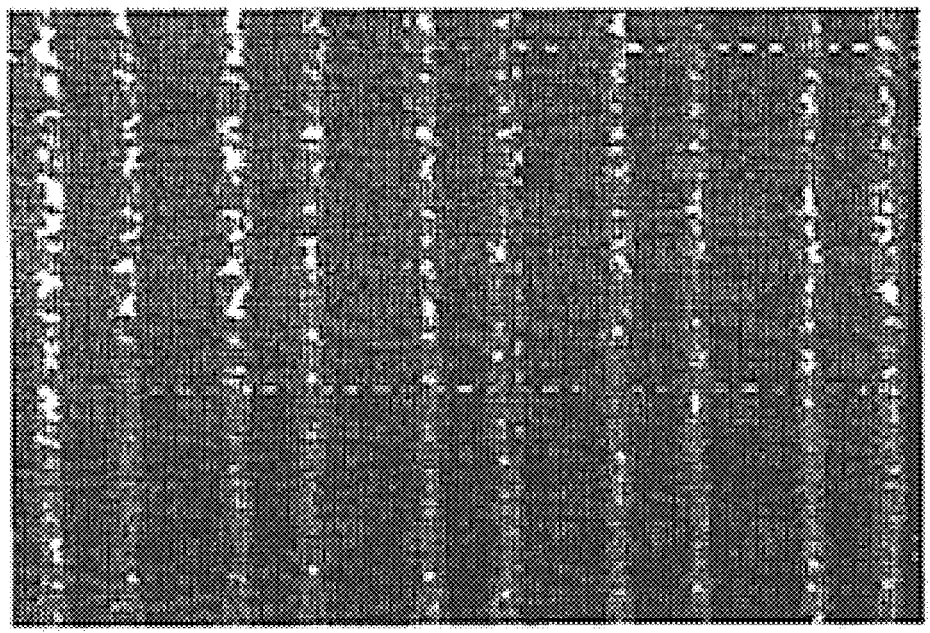
FIG. 2B is a photograph of a photoresist pattern obtained according to the present invention that is taken after approximately thirty seconds since the CD measurement using the SEM.

To 7.2 g of PGMEA (propylene glycol methyl ether acetate) solvent was added 1 g of poly(tert-butyl bicyclo[2.2.1]hept-5-ene-2-carboxylate/2-hydroxyethyl bicyclo[2.2.1]hept-5-ene-2-carboxylate/bicyclo[2.2.1]hept-5-ene-2-carboxylic acid/maleic anhydride), 0.012 g of triphenylsulfonium triflate, and 0.02 g of a thermal acid generator of Formula 2, and the resultant was filtered to obtain a photoresist composition. The photoresist composition was coated on the silicon wafer, baked at 110° C. for 90 seconds and exposed to light using ArF laser exposing device. The photoresist composition was post-baked at 110° C. for 90 seconds, and developed in 2.38 wt % aqueous TMAH solution to obtain a 138 nm L/S pattern right after measuring the CD of the pattern using the SEM (see FIG. 2A). The formed pattern was heated at 175° C. for 60 seconds and the CD was measured by using the SEM. At this time, no slimming occurred and 138 nm L/S pattern was maintained (see FIG. 2B).

As described above, according to the conventional method, the CD measurement using the SEM during a semiconductor processing was almost impossible due to the slimmed pattern as much as 26 nm. However, according to the present invention, the pattern after the CD measurement did not get slimmed, thus a semiconductor processing was proceeded regardless of the CD measurement.

Therefore, when a photoresist composition containing a thermal acid generator is employed for a photoresist pattern forming process and additionally the resultant pattern is heated after developing step, a cross-linking reaction occurs to patterning photoresist compositions, and the SEM-beam has no effect on the patterns, which consequently makes it easy to set up the CD target during the semiconductor process.

The foregoing discussion has been presented for purposes of illustration and description. The foregoing is not intended to limit the disclosure to the form or forms disclosed herein. Although the description of the disclosed methods has included description of one or more embodiments and certain variations and modifications, other variations and modifications are within the scope of the disclosure, e.g., as may be within the skill and knowledge of those in the art, after understanding the present disclosure. It is intended to obtain rights which include alternative embodiments to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed:

1. A process for forming a photoresist pattern comprising:
   (a) coating a photoresist composition comprising a thermal acid generator and a chemically amplified photoresist resin on a substrate to form a photoresist film wherein the chemically amplified photoresist resin comprises a cyclo olefin repeating unit having a hydroxyalkyl group;
   (b) exposing the photoresist film;
   (c) developing the exposed photoresist film to obtain a photoresist pattern; and
   (d) heating the photoresist pattern.

2. The process according to claim 1, wherein the photoresist composition further comprises a photoacid generator and an organic solvent.

3. The process according to claim 1, wherein the thermal acid generator is an alcohol comprising a leaving group.

4. The process according to claim 3, wherein the leaving group is on an ortho-position of a hydroxyl group.

5. The process according to claim 4, wherein the leaving group is a sulfonate.

6. The process according to claim 1, wherein the thermal acid generator is selected from the group consisting of compounds of the Formulas 1 to 4:

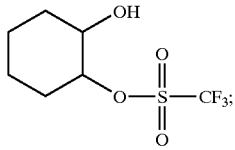

Formula 1

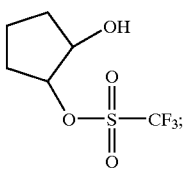

Formula 2

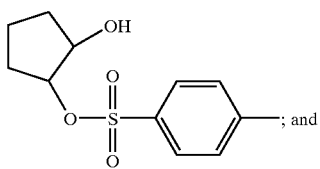

Formula 3

; and

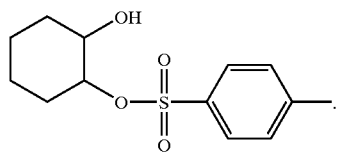

Formula 4

.

7. The process according to claim 1, wherein the chemically amplified photoresist resin further comprises more than one repeating unit selected from the group consisting of cyclo olefin repeating unit having a carboxyl group and maleic anhydride repeating unit.

8. The process according to claim 1, wherein the chemically amplified photoresist resin is poly(tert-butyl bicyclo[2.2.1]hept-5-ene-2-carboxylate/2-hydroxyethyl bicyclo[2.2.1]hept-5-ene-2-carboxylate/bicyclo[2.2.1]hept-5-ene-2-carboxylic acid/maleic anhydride).

9. The process according to claim 1, wherein the thermal acid generator is used in an amount of 0.1 to 5% by weight of the photoresist resin.

10. The process according to claim 2, wherein the photoacid generator is selected from the group consisting of diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, triphenylsulfonium hexafluoroarsenate, triphenylsulfonium hexafluoroantimonate, triphenylsulfonium triflate, dibutylnaphthylsulfonium triflate, phthalimidotrifluoromethane sulfonate, dinitrobenzyltosylate, n-decyl disulfone, naphthylimido trifluoromethane sulfonate and mixture thereof.

11. The process according to claim 2, wherein the photoacid generator is used in an amount ranging from 0.1 to 10 wt % of the photoresist resin.

12. The process according to claim 2, wherein the organic solvent is selected from the group consisting of diethyleneglycol diethyl ether, methyl 3-methoxypropionate, ethyl 3-ethoxypriopionate, propyleneglycol methyl ether acetate, ethyl lactate, cyclohexanone, 2-heptanone and mixture thereof.

13. The process according to claim 2, wherein the organic solvent is used in an amount ranging from 100 to 2000 wt % of the photoresist resin.

14. The process according to claim 1, wherein the exposing step (b) is carried out by using a light source selected from the group consisting of EUV (Extreme Ultra Violet), VUV (Vacuum Ultra Violet), ArF, KrF, E-beam, X-ray and ion beam.

15. The process according to claim 1, wherein the heating step (d) is carried out at a temperature of the thermal acid generator releasing an acid.

16. The process according to claim 15, wherein the temperature ranges from 150 to 250° C.

17. A semiconductor element manufactured by the process of claim 1.

* * * * *